INVENTORS.
ROBERT C. FERRAR
HEYWARD A. FRENCH

BY Alfred C. Hill

AGENT

INVENTORS.
ROBERT C. FERRAR
BY HEYWARD A. FRENCH
Alfred C. Hill
AGENT 3,118,113
Patented Jan. 14, 1964

3,118,113

DIVERSITY RECEIVING SYSTEM USING A LOW NOISE PARAMETRIC AMPLIFIER SYSTEM

Robert C. Ferrar, Highlands, and Heyward A. French, Ridgewood, N.J., assignors to International Telephone and Telegraph Corporation, Nutley, N.J., a corporation of Maryland Filed Apr. 21, 1960, Ser. No. 23,720
18 Claims. (Cl. 325—485)

This invention relates to low noise amplifier systems and more particularly to an improved low noise microwave amplifier of the variable reactance amplifier type.

The sensitivity of a VHF or UHF receiver is largely determined by the noise generated within the receiver itself. The noise generated within a receiver is measured in terms of its noise figure which may be minimized by employing a low noise microwave amplifier of sufficient gain at the receiver input.

Several low noise microwave amplifiers are available and may be broadly classified as masers, electron beam tubes, and variable reactance amplifiers, commonly referred to as parametric amplifiers. Of these types of amplifiers, the variable reactance amplifier utilizing a variable capacitive diode appears to offer the most practical solution to the problem of reducing noise figure. Masers, although capable of producing very low noise figures, require liquid helium cooling to temperatures near absolute zero. On the other hand, variable reactance amplifiers can produce noise figures under one decibel (db), even when operated at room temperature.

Essentially, the variable reactance amplifier consists of two tuned circuits coupled by a nonlinear reactance, a parameter which is varied at a frequency which is related to the resonant frequencies of the two tuned circuits. Preferably the nonlinear reactance is provided by a variable capacitance diode. When the common coupling reactance is varied at a frequency commonly referred to as a pump frequency, $f_p$, generated in an oscillator, commonly referred to as a pump oscillator, an effective negative resistance is introduced which causes an energy transfer from the pump oscillator to both tuned circuits. The tuned circuit tuned to the input signal $f$, is referred to as the signal tuned circuit and the circuit tuned to the idling frequency $f_1$ is referred to as the idling tuned circuit.

There are several different types of variable reactance amplifiers classified by the frequency to which the idling tuned circuit is tuned and the tuned circuit to which the output load is coupled. One type is called a lower sideband regenerative amplifier having the output load coupled to the signal tuned circuit providing a power gain defined as the ratio of the power output to the input power. A second type is called a lower sideband regenerative converter having the output load coupled to the idling tuned circuit which is tuned to the lower sideband frequency, that is, $f_p—f_s$ providing a power gain equal to the power grain of the regenerative amplifier plus the additional gain factor of $$\frac{f_1}{f_s}$$

Preferably this type of variable reactance amplifier is operated with $f_1$ greater than $f_s$ since less regeneration is needed to produce the desired gain and the system is more stable. A third type is called an upper sideband converter having the output load coupled to the idling tuned circuit which is tuned to the upper sideband frequency, that is, $f_p+f_s$. In this type of variable reactance amplifier, the ability to produce negative resistance (regeneration) is lost and the power gain is only the additional gain factor $$\frac{f_1}{f_s}$$

Due to the absence of regeneration, the upper sideband converter may be matched to give absolute stability. However, the limitation on gain generally results in a higher noise figure than obtained with the regenerative converter.

The employment of a regenerative converter type of variable reactance amplifier in a radio receiver has extended the range of the receiver an appreciable amount relative to the range of conventional radio receivers. Where such an amplifier is employed in a radio receiving section of an over-the-horizon communication system, the range of the over-the-horizon link was extended approximately 100 miles without an increase in transmitted power. Hence, the amplifier is capable of increasing the amplitude of the received signal without increasing the noise amplitude. In addition to its ability to extend the range at which signals may be used, the amplifier alternatively enables the transmitters of over-the-horizon links to cut broadcast power by as much as 90%, while providing the same services as previously. Of course, a combination of decreased power and increased distance may also be obtained. Substantial economic savings are provided by the variable reactance amplifier by reason of lower power consumption, less expensive equipment and/or greater distance per link resulting in fewer links.

One of the effects of employing a lower sideband regenerative converter type variable reactance amplifier is that an output signal is provided having a center frequency greater than the center frequency of the incoming signal. This frequency increase comes about since $f_1$, the frequency of the idling tuned circuit and, hence, the output signal, is equal to $f_p—f_s$ and $f_s$ is normally less than half the value of $f_p$. It is, therefore, necessary to reduce this increase in frequency of the output signal without increasing the noise level to utilize the usual VHF and UHF intermediate frequency amplifiers. In this type of variable reactance amplifier, it is also necessary that the pump oscillator be highly frequency stable since frequency fluctuations in $f_p$ will affect the stability of the frequency of the output signal from the low noise amplifier. This stability requirement necessitates complicated oscillator design with a resultant increased cost and substantially eliminates the utilization of convential, commercially available, reflex klystrons as the pump oscillator.

A low noise amplifier system has been provided to substantially eliminate the effect of fluctuations of the pump oscillator frequency from the output signal and reduce the increased frequency output of the variable reactance amplifier to a frequency less than the input frequency level. In this system an auxiliary regenerative converter amplifier operated from the pump oscillator as the main regenerative converter amplifier employs a low frequency, low power oscillator as the input signal source. The output signal of the auxiliary converter amplifier and the output signal of the main converter amplifier are coupled to a heterodyning circuit to provide a system output signal having a center frequency no greater than the center frequency of the input signal and having cancelled therefrom the influence of any frequency fluctuations of the pump oscillator. In one reduction to practice, this system was operated to provide an intermediate frequency signal having a center frequency of 70 megacycles (mc.) with an input signal having a center frequency of 900 mc., a pump oscillator having a frequency of 9900 mc. and a low frequency oscillator having a frequency of 70 mc. While this system solved the problems outlined hereinabove for the regenerative converter amplifier, there still was the problem of signal fluctuation due to frequency instability of the lower frequency oscillator with the attendant variations in the center frequency of the resultant system output signal.

Therefore, an object of this invention is to provide a low noise amplifier system of the variable reactance type substantially eliminating the disadvantages of the variable reactance low noise amplifier systems previously employed.

Another object of this invention is to provide a low noise amplifier system of the variable reactance type having a greater gain than previously employed variable reactance amplifier systems with greater stability and an output signal at the same frequency as the input signal independent of frequency variations in the signals generated internally of the amplifier system.

A further object of this invention is to provide an improved diversity receiver employing a predetection combining system utilizing the techniques of the improved low noise amplifier system described herein to obtain the improved characteristics thereof, the amplifier system including several different components each of which is common to the received signals to reduce the equipment in the receiver and still realize the improved characteristics.

A feature of this invention is the provision of an oscillator and a variable reactance amplifier coupled to a source of input signals having a predetermined frequency. A first means is coupled to the output of the variable reactance amplifier and the oscillator providing a low noise, amplified version of the input signals having a frequency different than the predetermined frequency and a second means is coupled to the first means and the oscillator to cooperate in providing a low noise, amplified version of the input signals having a frequency equal to the predetermined frequency.

Another feature of this invention is the provision of a first variable reactance amplifier coupled to a source of input signals having a predetermined frequency and a pump oscillator operating on the first variable reactance amplifier to provide a low noise, amplified version of the input signals having a frequency different than the predetermined frequency. A second variable reactance amplifier is coupled to the pump oscillator and a second oscillator to provide a local oscillator signal of relatively high gain to cooperate with the output of the first amplifier in a heterodyning circuit to provide a low noise, amplified version of the input signal having a frequency substantially equal to the frequency difference between the frequency of the signal input and the frequency of the signal of the second oscillator, compensating for any frequency variations in the pump oscillator signal by cancelling the pump oscillator signal. A third amplifier is coupled to the output of the heterodyning circuit and the second oscillator to provide as the system output signal a low noise, amplified version of the input signals having a frequency equal to the predetermined frequency, compensating for any frequency fluctuations present in the signals of the second oscillator by cancelling the second oscillator signal.

A further feature of this invention is the provision of a predetection diversity combining system arrangement utilizing the techniques of the above-described improved low noise amplifier including a single pump oscillator coupled to first and second variable reactance amplifiers located in each of the signal channels, each of the second amplifiers having a separate low frequency oscillator coupled thereto, and a mixer disposed in each of the signal channels coupled to the output of the associated one of the first and second amplifiers to provide a resultant intermediate frequency signal for each channel having the same frequency. The resultant signals in each channel are compared in phase to produce a control signal proportional to the phase difference between the resultant signals utilized to control at least one of the low frequency oscillators to adjust the phase of its associated resultant signal to maintain the resultant signals of each signal channel in a desired phase relationship with respect to each other for inphase combining in a combiner circuit. Another variable reactance amplifier is coupled to the output of the combiner circuit and at least one of the low frequency oscillators to thereby provide as a combined output signal a low noise, amplified verision of the input signals having the same frequency as the input signal applied to at least one of the signal channels. A quadruple diversity combining system may be provided by duplicating the above equipment and coupling the two combined output signals to a dual diversity combining system of either the predetection or post-detection type.

The above-mentioned and other features and objects of this invention will become more apparent by reference to the following description taken in conjunction with the accompanying drawings, in which.

Figure 1:
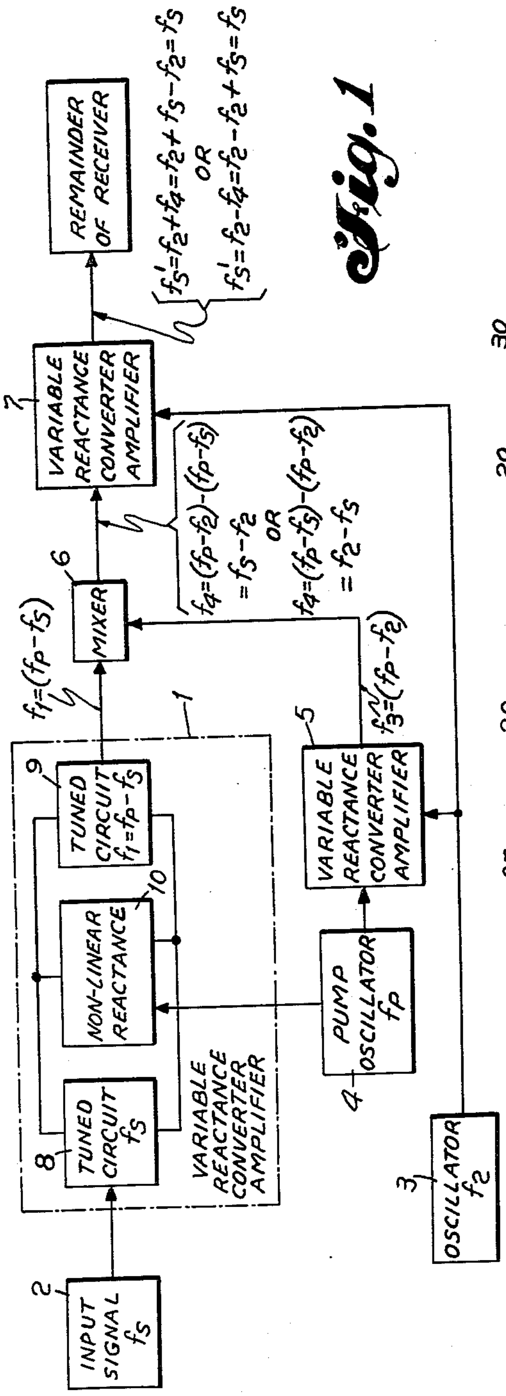
FIG. 1 is a schematic diagram in block form of a low noise amplifier system in accordance with the principles of this invention.

Referring to FIG. 1, there is illustrated a low noise, amplifier system operating to amplify a signal applied to its input without any frequency conversion, in other words, the center frequency of the output signal is the same as the center frequency of the input signal, and without introducing receiver noise. This amplifier system would have particular utility as a radio frequency amplifier for a radio receiver but is not necessarily limited to this use.

In the discussion to follow, the frequencies indicated at various locations in the low noise amplifier system of FIG. 1 are the center frequency of the signals being received, the frequency of the oscillators, and the center frequency of the resultant beat frequency signals without regard to the particular type of modulation (amplitude, phase or frequency) being carried by the signals.

Basically, the low noise amplifier system of FIG. 1 includes a variable reactance converter amplifier 1 coupled to a source of input signals 2 having a predetermined center frequency $f_s$ and an oscillator 3 having a low level, relatively low frequency signal $f_2$. A first means including pump oscillator 4, variable reactance converter amplifier 5, and mixer 6 is coupled to the output of amplifier 1 and oscillator 3 to provide a low noise, amplified version of the signals of source 2 having a center frequency different than the predetermined center frequency. A second means, such as variable reactance converter amplifier 7, is coupled to the output of the first means and the output of oscillator 3 to provide as the amplifier system signal output a low noise, amplified version of the signal of source 2 having a center frequency equal to the predetermined center frequency of the signal of source 2.

More specifically, the system of this invention includes a variable reactance converter amplifier 1 having a tuned circuit 8, the signal tuned circuit, tuned to the frequency of the signal of source 2, $f_s$, and a tuned circuit 9, the idling tuned circuit, tuned to a frequency $f_1$, the idling frequency, which will have a value related to the input signal frequency $f_s$ and the pump frequency $f_p$ depending upon whether amplifier 1 is a regenerative converter amplifier or a nonregenerative converter amplifier. In the specific instance illustrated, the tuned circuit 9 of amplifier 1 is tuned to $f_1=f_p-f_s$ and is, therefore, a regenerative converter amplifier providing the added gain factor of $$\frac{f_1}{f_s}$$

The tuned circuits 8 and 9 have disposed therebetween a common, nonlinear reactance 10, preferably a capacitor reactance in the form of semiconductor diode, which when varied by the frequency of the pump oscillator 4 causes an interchange of energy between the tuned circuits and the pump oscillator. The resultant output of amplifier 1 is a signal equal to $f_1=f_p-f_s$, the difference between the pump frequency and the signal frequency. Variable reactance converter amplifier 5 has the same internal structure as amplifier 1 but with its idling tuned circuit tuned to a frequency $f_3=f_p-f_2$.

The outputs of amplifiers 1 and 5 are coupled to mixer 6 wherein the signal having a center frequency $f_1$ and the signal having a center frequency $f_3$ are heterodyned to produce a difference or beat frequency equal to $f_4$. Variable reactance converter amplifier 7, which has the same internal structure as amplifier 1, is coupled to the output of mixer 6 to inject the beat frequency $f_5$ into the signal tuned circuit of amplifier 7. The output signal of oscillator 3 is coupled to the nonlinear reactance of amplifier 7 to vary the reactance in the same manner that the signal of pump oscillator 4 varies the nonlinear reactance of amplifiers 1 and 5. The idling tuned circuit in the converter amplifier 7 is tuned either to a frequency $f_s'=f_2+f_4$ or $f_s'=f_2-f_4$ depending upon whether the signal of oscillator 3 has a frequency above or below the frequency of the input signal from source 2. If the output circuit or idling tuned circuit is tuned to $f_2-f_4$, converter amplifier 7 is a regenerative converter amplifier having the additional gain factor of $$\frac{f_s'}{f_4}$$

while if the idling tuned circuit is tuned to $f_2+f_4$, converter amplifier 7 is a nonregenerative converter amplifier having a gain equal to only $f_s'/f_4$. If amplifier 7 is employed as a nonregenerative converter amplifier, the amplifier system will provide the desired low noise amplification, although not as high if amplifier 7 were operated as a regenerative amplifier, an output signal having the same center frequency as the input signal and the inherent increase in stability present in nonregenerative amplifiers.

To illustrate that the output signal of amplifier 7 and, hence the output signal of the low noise amplifier system has the same center frequency as the signal of source 2, an example will be presented both for that situation where $f_2$ is above $f_s$ and that situation where $f_2$ is below $f_s$. Illustrative frequency values will be given the various frequencies indicated on the drawings in the table below for both situations. It is to be remembered that these values are only for the purposes of explanation and are not meant to limit the operation of the amplifier system to these values.

| Parameter | Example 1 | Example 2 |
|---|---|---|
| $f_s$ | 1,000 mc. | 1,000 mc. |
| $f_t$ | 11,000 mc. | 11,000 mc. |
| $f_2$ | 950 mc. | 1,050 mc. |
| $f_3$ | 10,050 mc. | 9,950 mc. |
| $f_1$ | 10,000 mc. | 10,000 mc. |
| $f_4$ | $f_s-f_2=50$ mc. | $f_2-f_s=50$ mc. |
| $f_s'$ | $f_2+f_4=1,000$ mc. | $f_2-f_4=1,000$ mc. |

It will be appreciated from the above table and equations presented in FIG. 1 that the low noise amplifier system of this invention provides the desired amplification of the input signal $f_s$ from source 2 and presents at the output thereof, the output of amplifier 7, an amplified version of input signal having relatively low noise and a center frequency $f_s'$ which is equal to the center frequency of the input signal $f_s$ from source 2. Thus, this amplifier system provides as an output signal a low noise, amplified verson of the input signal having the same center frequency as the input signal which will then be coupled to succeeding circuits for utilization therein such as the remainder of a radio receiver including the modulation detector. A review of the equations presented in FIG. 1 demonstrates that this amplifier system provides a system output signal, the output signal of amplifier 7, independent of the frequency of the pump oscillator 4 and the frequency of oscillator 3 and, hence, independent of any frequency variations thereof. Thus, the previous requirement of stability placed on these two oscillators can be reduced since the fluctuations that may occur in the output signals of these oscillators are completely compensated for in the amplifier system of this invention and, hence, superstability of these oscillators are no longer required and the complexity of such stability control arrangement may be eliminated.

The amplifier system of this invention provides an overall gain higher than the gain of previously employed amplifier systems with greater stability. The higher gain is achieved because there are two variable reactance amplifiers operated in cascade which will provide a greater gain than one amplifier, a gain equal to the product of the gain of the individual amplifier, and the greater stability is achieved because the required regeneration needed in the individual variable reactance amplifier of the present system is less than that required for a system employing a single regenerative converter amplifier due to the gain achieved in the overall amplifier system. Furthermore, the amplifier system of this invention may be utilized in predetection diversity combining systems, such as phase combining systems, resulting in an arrangement which will not require duplication of the components of the amplifier system of FIG. 1 for each diversity signal channel and, hence, a reduction in the components for the combining system is realized as is illustrated in FIG. 2.

Figure 2:
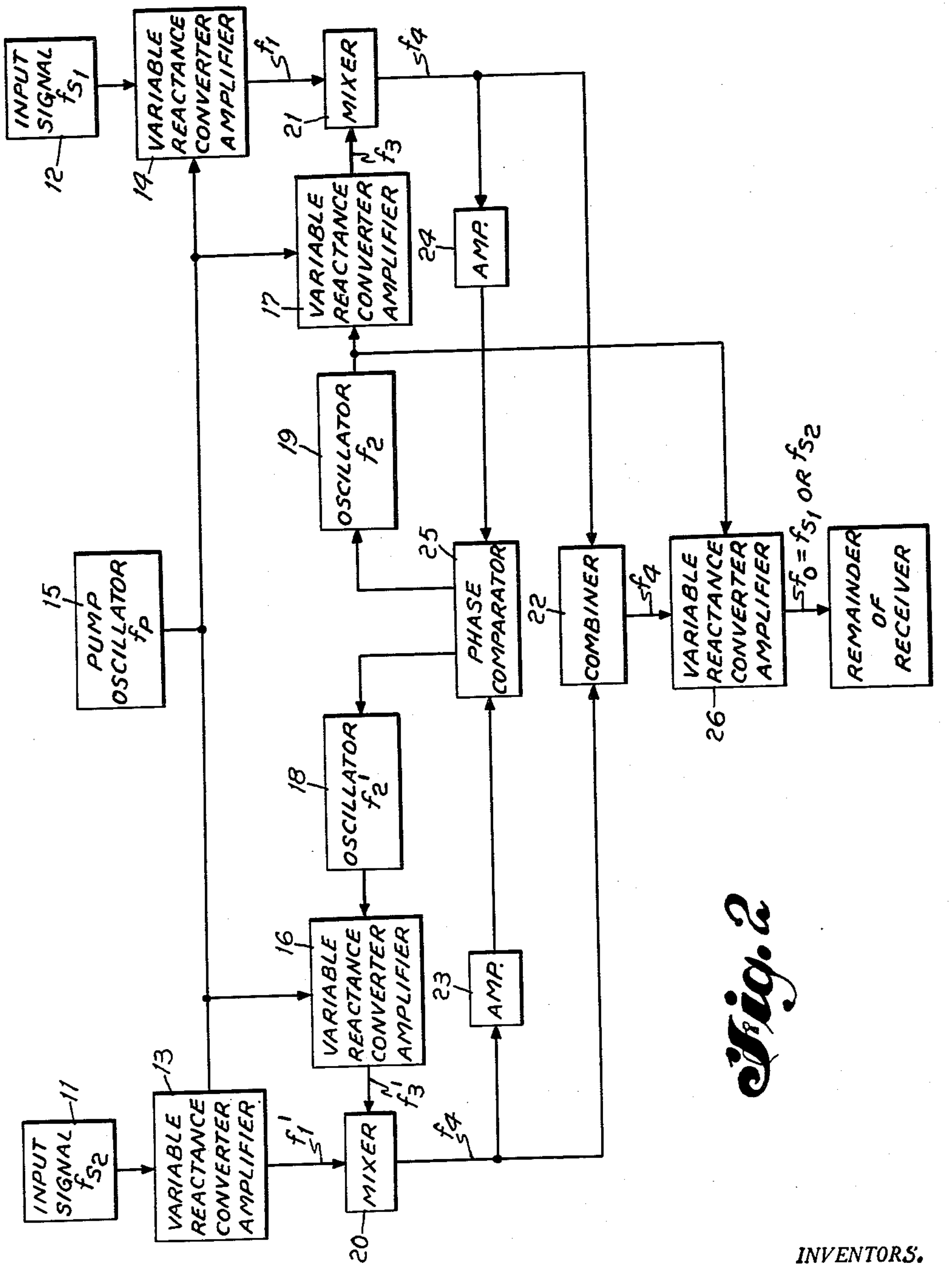
FIG. 2 is a schematic diagram in block form of a predetection combining system utilizing the low noise amplifier of FIG. 1 in accordance with the principles of this invention.

Referring to FIG. 2, an improved dual diversity predetection combining circuit is illustrated employing the techniques set forth hereinabove with respect to the low noise amplifier of FIG. 1. Two sources of input signals 11 and 12 represent the inputs to the combining circuit. The signals of these sources 11 and 12 may have different predetermined center frequencies $f_{s1}$ and $f_{s2}$ containing thereon substantially the same intelligence signal and having unknown and varying phase relative to each other due to the different propagation characteristic encountered by these two signals, such as occurs in over-the-horizon communication system, where the system of FIG. 2 could be advantageously employed. The signals of sources 11 and 12 could be provided by the spaced antennas of a space diversity system ($f_{s1}=f_{s2}$), the frequency spaced channels of a frequency diversity system ($f_{s1}\neq f_{s2}$), the channels of a time diversity system ($f_{s1}=f_{s2}$ or $f_{s1}\neq f_{s2}$), or the signal channels of an angle diversity system ($f_{s1}=f_{s2}$ or $f_{s1}\neq f_{s2}$). Regardless of the diversity system being employed it is required that the ultimate signals being combined be equal in frequency. This requirement can be satisfied in those diversity systems where the diversity signals are spaced in frequency by employing local oscillators having appropriately selected frequencies to render the frequency of the signals being combined equal.

The outputs of sources 11 and 12 are coupled to variable reactance converter amplifiers 13 and 14, respectively, each of which is similar in internal structure and operation to amplifier 1 of FIG. 1. The nonlinear reactance of the amplifiers 13 and 14 is varied by the signal of pump oscillator 15 coupled in common to amplifiers 13 and 14. Thus, one pump oscillator serves both signal channels to reduce duplication of equipment in adapting the amplifier system of FIG. 1 to a predetection combining system. The output of pump oscillator 15 is likewise coupled to the variable reactance converter amplifiers 16 and 17 which in conjunction with the signals of oscillators 18 and 19 provide the local oscillator signals $f_3$ and $f_3'$ for their respective diversity signal channels. The arrangement of amplifier 16 and oscillator 18 and the arrangement of amplifier 17 and oscillator 19 are substantially the same in structure and operation as the arrangement of amplifier 5 and oscillator 3 of FIG. 1. The signal output $f_3'$ of amplifier 16 and the signal output $f_1'$ of amplifier 13 are coupled to mixer 20 to produce a beat or difference frequency signal $f_4$. The signal output $f_3$ of amplifier 17 and the signal output $f_1$ of amplifier 14 are coupled to mixer 21 to produce a beat or difference frequency signal $f_4$. The frequency $f_4$ is different than either of the frequencies $f_{s1}$ or $f_{s2}$.

It is well known in phase combining systems that the two signals being combined must have the same frequency and have a predetermined phase relationship with respect to each other so that they may be combined substantially inphase. In the system of FIG. 2, the output signals $f_4$ of mixers 20 and 21 are coupled to a combiner 22 for inphase combining therein. To assure that the signals being combined have the desired phase relationship for inphase combining in combiner 22, the outputs of mixers 20 and 21 are coupled respectively through amplifiers 23 and 24 to a phase comparator 25 to compare the phase of the output signals of mixers 20 and 21 to provide a phase control signal proportional to the phase difference between the output signals of mixers 20 and 21. This phase control signal may be coupled to one of the oscillators 18 and 19 to adjust the frequency thereof to control the phase of the output signal of mixer 20 or 21 to dispose the output signals of mixers 20 and 21 in the desired phase relationship with respect to each other for inphase combining in combiner 22. While this arrangement will provide the desired phase control, it is preferred that the phase control signal is coupled in push-pull to both oscillators 18 and 19 so that the phase of the output signal of both mixers 20 and 21 will be adjusted in opposite direction to place these output signals in the desired phase relationship for inphase combining in combiner 22.

The combined signal at the output of combiner 22 has an amplitude proportional to the sum of the amplitude of the signals applied to the inputs of combiner 22. The frequency of the combined output signal, however, is less than the frequency of either of the input signals from sources 11 and 12 and, as pointed out hereinabove having the highest frequency, illustrated to be the output signal of oscillator 19, coupled to its nonlinear reactance. The operation of amplifier 26 is similar to that of amplifier 7 of FIG. 1 to produce an output signal for the predetection combining system for coupling to the remainder of the receiver which includes the advantage of the phase combining techniques and the advantages set forth hereinabove with respect to the low noise amplifier system of FIG. 1. The utilization of only one converter amplifier coupled to one of the low frequency oscillators to return the frequency of the system output signal to either $f_{s1}$ or $f_{s2}$ illustrates a further reduction in the amount of equipment that is realized by utilizing the low noise amplifier system of FIG. 1 in a predetection combining circuit such as illustrated in FIG. 2.

The amplifiers 23 and 24 in the automatic phase control loops need not have equal gain but the signal path between the output of mixer 20 and the input of phase comparator 25 must have the same time delay as the signal path between the output of mixer 21 and the input of phase comparator 25. The manner of obtaining the desired equal time delay in amplifiers 23 and 24 can be obtained by proper design techniques well known to those skilled in the art. For instance, a small adjustable delay line may be incorporated with each of the amplifiers to aid in equalizing the time delay of the amplifiers.

Full statistical advantage applies for the predetection diversity combining system of FIG. 2 for threshold considerations in frequency modulation (FM) systems along with the low noise advantage of variable reactance amplification with good stability.

To illustrate the noise figure obtainable with the system of FIG. 2, let us assume the following values and determine the noise figure that could be achieved for two different values of gain for amplifiers 13 and 14, the values being assumed being reasonable and practical within the present state of the art. The symbol F is equal to the noise factor and the symbol G is equal to the gain. The subscripts employed with F and G are the reference characters of the various components in the combining system that enter into the determination of the noise figure NF of the combining system.

*Example I*

$G_{14}=100$ (20 db) ---------- $F_0=F_{14}+\frac{F_{21}-1}{G_{14}}+\frac{F_{22}-1}{G_{14}G_{21}}+\frac{F_{26}-1}{G_{14}G_{21}G_{22}}$ $F_{14}=1.28$ (1.04 db) ---------- $F_0=1.28+\frac{5-1}{100}+\frac{2-1}{100\times 1/4}+\frac{1.33-1}{100\times 1/4}\times\frac{1}{2.5}$ $F_{21}=f$ (7 db).

$F_{22}=2$ (3 db).

$G_{21}=1/4$ (−6 db) ---------- $F_0=1.28+\frac{4}{100}+\frac{4}{100}+\frac{0.33\times 4\times 2.5}{100}$ $G_{22}=1/2.5$ (−4 db) ---------- $F_0=1.28+0.04+0.04+0.033$ $F_{26}=1.33$ (1.25 db) ---------- $F_0=1.393$ $NF=10\log F_0=10\log 1.393=10\times 0.144=1.44$ db

*Example II*

Figure 3:
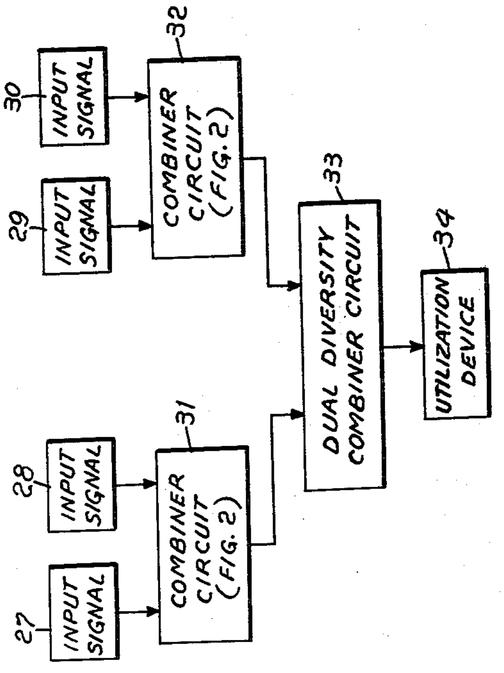
FIG. 3 is a schematic diagram in block form of a quadruple diversity combining system including the dual diversity combining system of FIG. 2.

$G_{14}=G_{26}400$ (26 db) ---------- $F_0=1.28+\frac{4}{100}+\frac{4}{100}+\frac{0.33\times 4\times 2.5}{400}$ Other values remain the same ---------- $F_0=1.28+0.01+0.01+0.088$ $F_0=1.308$ $NF=10\log F_0=10\log 1.308=1.165$ db with respect to FIG. 1, certain advantages accrued from having the frequency, $f_0$, of the signal from the low noise amplifier the same as the frequency of at least one of the input signals. To maintain this advantage in the predetection combining circuit of FIG. 2, there is provided at the output of combiner 22 a variable reactance amplifier 26 having the output signal of combiner 22 coupled to its signal tuned circuit and the output signal of one of the oscillators 18 and 19, usually the oscillator Referring to FIG. 3, there is illustrated therein a quadruple diversity combining system capable of combining diversity signals each of which is sufficiently uncorrelated to enable the full statistical advantage of a fourfold diversity advantage for threshold considerations in FM systems. The four diversity signals are illustrated to be supplied by sources 27, 28, 29 and 30. As pointed out hereinabove with respect to FIG. 2, the input signals from sources 27 and 28 coupled to combiner circuit 31 and the input signals from sources 29 and 30 coupled to combiner circuit 32 may each have frequency spaced center frequencies, or the pairs of input signals may each have a common center frequency with the common center frequency of each pair of input signals being spaced in frequency depending upon the combination of diversity techniques employed. For instance, the input signals provided by sources 27 and 28 could be at one common center frequency provided by a spaced diversity system for application to combiner circuit 31 while the input signal from sources 29 and 30 coupled to combiner 32 could be at a second common center frequency spaced from the center frequency of the signals of sources 27 and 28 to provide a frequency diversity arrangement with respect to the signals of sources 27 and 28. Combiner circuits 31 and 32 would take the form of the combiner illustrated and described in connection with FIG. 2 with the outputs from the last variable reactance converter amplifier, namely, the amplifier similar to the amplifier 26 of FIG. 2 being coupled to a dual diversity combiner circuit 33 to provide a single output signal for coupling to a utilization device 34. Combiner circuit 33 may take the form of the usual predetection phase combining system wherein the output signals from combiners 31 and 32 are converted to an intermediate frequency signal having a common center frequency in a heterodyning arrangement, the phase of the resultant signals being compared and corrected in a manner similar to that illustrated in connection with FIG. 2 to enable the inphase combining of the two intermediate frequency signals, the combined signal being applied to utilization device 34. Another form which combiner circuit 33 might conceivably take is that of a post detection combining system wherein the output signals of combiner circuits 31 and 32 are coupled to linear limiter circuits which maintain the ratio of the detected output signal of the two channels identical to the ratio of the two signals applied to the input thereof. The baseband output of the detector circuits would then be combined to provide the single signal having a diversity advantage for utilization in device 34.

While we have described the principles of our invention in connection with specific apparatus, it is to be clearly understood that this description is made only by way of example and not as a limitation to the scope of our invention as set forth in the objects thereof and in the accompanying claims.

We claim:

1. A low noise amplifier system comprising a variable reactance amplifier, a source of input signals having a predetermined frequency coupled to the input of said amplifier, a first oscillator, a second oscillator, a first means coupled to the output of said first and second oscillators and said amplifier to provide a low noise, amplified version of said input signals having a frequency different than said predetermined frequency, and a second means coupled to the output of said first means and said second oscillator to provide a low noise, amplified version of said input signals having a frequency equal to said predetermined frequency.

2. A low noise amplifier system comprising a first variable reactance amplifier, a source of input signals having a predetermined frequency coupled to the input of said first amplifier, a first oscillator, a second oscillator, a means coupled to the output of said first amplifier and the output of said first and second oscillators to provide a low noise, amplified version of said input signals having a frequency different than said predetermined frequency, and a second variable reactance amplifier coupled to the output of said means and said second oscillator to provide a low noise, amplified version of said input signals having a frequency equal to said predetermined frequency.

3. A low noise amplifier system comprising a first variable reactance amplifier, a source of input signals having a predetermined frequency coupled to the input of said first amplifier, a first oscillator, a second oscillator, means coupling the output of said first oscillator to said first amplifier, a second variable reactance amplifier coupled to the output of said first and second oscillators, a first means coupled to the output of said first and second amplifiers to provide a low noise, amplified version of said input signals having a frequency different than said predetermined frequency, and a second means coupled to the output of said first means and said second oscillator to provide a low noise, amplified version of said input signals having a frequency equal to said predetermined frequency.

4. A low noise amplifier system comprising a first variable reactance amplifier, a source of input signals having a predetermined frequency coupled to the input of said first amplifier, a first oscillator coupled to said first amplifier, a second oscillator, a second variable reactance amplifier coupled to the output of said first and second oscillators, a mixer coupled to the output of said first and second amplifiers, and means coupled to the output of said mixer and said second oscillator to provide a low noise, amplified version of said input signals having a frequency equal to said predetermined frequency.

5. A low noise amplifier system comprising a first variable reactance amplifier, a source of input signals having a predetermined frequency coupled to the input of said first amplifier, a first oscillator coupled to said first amplifier, a second oscillator, a second variable reactance amplifier coupled to the output of said first and second oscillators, means coupled to the output of said first and second amplifiers to combine the resultant output signals therefrom in a predetermined manner, and a third variable reactance amplifier coupled to the output of said combining means and said second oscillator to provide a low noise, amplified version of said input signals having a frequency equal to said predetermined frequency.

6. A low noise amplifier system comprising a first variable reactance amplifier, a source of input signals having a predetermined frequency coupled to said first amplifier, a first oscillator coupled to said first amplifier, a second oscillator, a second variable reactance amplifier coupled to the output of said first and second oscillators, a mixer coupled to the output of said first and second amplifiers, and a third variable reactance amplifier coupled to the output of said mixer and said second oscillator to provide a low noise amplified version of said input signals having a frequency equal to said predetermined frequency.

7. A low noise amplifier system comprising a source of input signals having a first frequency, a first oscillator producing a signal having a second frequency, a first variable reactance amplifier coupled to said source and the output of said first oscillator providing a first output signal having a third frequency equal to the difference between said first and second frequencies, a second oscillator producing a signal having a fourth frequency, a second variable reactance amplifier coupled to the output of said first and second oscillators to provide a second output signal having a fifth frequency equal to the difference between said first and fourth frequencies, said first frequency being greater than said fourth frequency, a mixer circuit coupled to the output of said first and second amplifiers to heterodyne the first and second output signals to provide a third output signal having a sixth frequency equal to the difference between said first and fourth frequencies, and a third variable reactance amplifier coupled to the output of said mixer and the output of said second oscillator having its output circuit tuned to a frequency equal to the sum of said fourth frequency and said sixth frequency to provide a low noise, amplified version of said input signals having a frequency equal to said first frequency.

8. A low noise amplifier system comprising a source of input signals having a first frequency, a first oscillator producing a signal having a second frequency, a first variable reactance amplifier coupled to said source and the output of said first oscillator having its output circuit tuned to provide a first output signal having a third frequency equal to the difference between said first and second frequencies, a second oscillator producing a signal having a fourth frequency, a second variable reactance amplifier coupled to the output of said first and second oscillators having its output circuit tuned to a fifth frequency equal to the difference between said second and fourth frequencies, a mixer circuit coupled to the output of said first and second amplifiers to produce a second output signal having a sixth frequency equal to the difference between said first and fourth frequencies, said fourth frequency being greater than said first frequency, and a third variable reactance amplifier coupled to the output of said mixer circuit and said second oscillator having its output circuit tuned to a frequency equal to the difference between said sixth frequency and said fourth frequency to provide a low noise, amplified version of said input signals having a frequency equal to said first frequency.

9. A low noise amplifier system comprising a source of input signals having a first frequency, a first variable reactance amplifier coupled to the output of said source of input signal, a first source of signal having a second frequency, a second variable reactance amplifier coupled to the output of said first source, a second source of signal having a third frequency, first means to couple the signal of said second source to said first amplifier to produce a first low noise, amplified version of said input signals having a frequency related to said first and third frequencies, second means to couple the signal of said second source to said second amplifier to produce an output signal having a frequency related to said second and third frequencies, third means coupled to the output of said first and second amplifiers to produce a second low noise, amplified version of said input signals having a frequency related to said first and second frequencies, and fourth means coupled to the output of said third means and said first source to provide as an output signal for said system, a low noise, amplified version of said input signals having a frequency equal to said first frequency.

10. A low noise amplifier system comprising a source of input signals having a first frequency, a first variable reactance amplifier coupled to the output of said source, a first oscillator generating a signal having a second frequency, a second variable reactance amplifier coupled to the output of said first oscillator, a second oscillator generating a signal having a third frequency, first means to couple the signal of said second oscillator to said first amplifier to provide a first low noise amplified version of said input signals having a frequency related to said first and third frequencies, second means to couple the signal of said second oscillator to said second amplifier to provide an output signal having a frequency related to said second and third frequencies, third means coupled to the output of said first and second amplifiers to provide a second low noise amplified version of said input signals having a frequency related to said first and second frequencies, and fourth means coupled to the output of said third means and said first oscillator to provide as an output signal for said system, a low noise, amplified version of said input signals having a frequency equal to said first frequency.

11. A low noise amplifier system comprising a source of input signals having a first frequency, a first variable reactance amplifier coupled to the output of said source, a first oscillator generating a signal having a second frequency, a second variable reactance amplifier coupled to the output of said first oscillator, a second oscillator generating a signal having a third frequency, first means to couple the signal of said second oscillator to said first amplifier to provide a first low noise, amplified version of said input signals having a frequency related to said first and third frequencies, second means to couple the signal of said second oscillator to said second amplifier to provide an output signal having a frequency related to said second and third frequencies, third means coupled to the output of said first and second amplifiers to provide a second low noise, amplified version of said input signals having a frequency related to said first and second frequencies, and a third variable reactance amplifier coupled to the output of said third means and said first oscillator to provide as an output signal for said system, a low noise, amplified version of said input signals having a frequency equal to said first frequency.

12. A predetection signal combining circuit comprising a first source of input signals having a first frequency and a second source of input signals having a second frequency related to said first frequency in a predetermined manner, the input signals of said first and second sources having unknown and varying phase relative to each other, a first variable reactance amplifier coupled to said first source, a second variable reactance amplifier coupled to said second source, a first oscillator, a second oscillator, a first means coupled to the output of said first amplifier and said first oscillator to provide a first output signal equal to a low noise, amplified version of said input signals of said first source having a frequency different than said first and second frequencies, a second means coupled to the output of said second amplifier and said second oscillator to provide a second output signal equal to a low noise, amplified version of said input signals of said second source having a frequency equal to the frequency of said first output signal, a third means coupled to the output of said first and second means and to at least one of said first and second oscillators to maintain said first and second output signals in a predetermined phase relationship with respect to each other for inphase combining thereof, a fourth means coupled to the output of said first and second means to combine said first and second output signals, and a fifth means coupled to the output of said fourth means and the output of at least one of said first and second oscillators to provide a low noise, amplified version of said input signals having a frequency equal to at least one of said first and second frequencies.

13. A predetection signal combining circuit comprising a first source of input signals having a first frequency and a second source of input signals having a second frequency related to said first frequency in a predetermined manner, the input signals of said first and second sources having unknown and varying phase relative to each other, a first variable reactance amplifier coupled to said first source, a second variable reactance amplifier coupled to said second source, an oscillator coupled to said first and second amplifiers, a first means coupled to the output of said first amplifier and said oscillator to provide a first output signal equal to a low noise, amplified version of said input signals of said first source having a frequency different than said first and second center frequencies, a second means coupled to the output of said second amplifier and said oscillator to provide a second output signal equal to a low noise, amplified version of said input signals of said second source having a frequency equal to the frequency of said first output signal, a third means coupled to the output of said first and second means operable on at least one of said first and second means to maintain said first and second output signals in a predetermined phase relationship with respect to each other for inphase combining thereof, a fourth means coupled to the output of said first and second means to combine said first and second output signals, and a fifth means coupled to the output of said fourth means and to a given portion of at least one of said first and second means to provide a low noise, amplified version of said input signals having a frequency equal to at least one of said first and second frequencies.

14. A predetection signal combining circuit comprising a first source of input signals having a first frequency and a second source of input signals having a second frequency related to said first frequency in a predetermined manner, the input signals of said first and second sources having unknown and varying phase relative to each other, a first variable reactance amplifier coupled to said first source, a second variable reactance amplifier coupled to said second source, a first oscillator coupled to said first and second amplifiers, a second oscillator, a third oscillator, a first means coupled to the output of said first amplifier and the output of said first and second oscillators to provide a first output signal equal to a low noise, amplified version of said input signals of said first source having a frequency different than said first and second frequencies, a second means coupled to the output of said second amplifier and the output of said first and third oscillators to provide a second output signal equal to a low noise, amplified version of said input signals of said second source having a frequency equal to the frequency of said first output signal, a third means coupled to the output of said first and second means and to at least one of said second and third oscillators to maintain said first and second output signals in a predetermined phase relationship with respect to each other for inphase combining thereof, a fourth means coupled to the output of said first and second means to combine said first and second output signals, and a second variable reactance amplifier coupled to the output of said fourth means and the output of at least one of said second and third oscillators to provide a low noise, amplified version of said input signals having a frequency equal to at least one of said first and second frequencies.

15. A predetection signal combining circuit comprising a first source of input signals having a first frequency and a second source of input signals having a second frequency related to said first frequency in a predetermined manner, the input signals of said first and second sources having unknown and varying phase relative to each other, a first variable reactance amplifier coupled to said first source, a second variable reactance amplifier coupled to said second source, a first oscillator coupled to said first and second amplifiers, a second oscillator, a third oscillator, a third variable reactance amplifier coupled to the output of said first and second oscillators, a first means coupled to the output of said first and third amplifiers to provide a low noise, amplified version of said input signals of said first source having a frequency different than said first and second frequencies, a fourth variable reactance amplifier coupled to the output of said first and third oscillators, a second means coupled to the output of said second and fourth amplifiers to provide a second output signal equal to a low noise, amplified version of said input signals of said second source having a frequency equal to the frequency of said first output signal, a phase comparator coupled to the output of said first and second means to produce a control signal proportional to the phase difference between said first and second output signals, a third means to couple said control signal to at least one of said second and third oscillators to maintain said first and second output signals in a predetermined phase relationship with respect to each other for inphase combining thereof, a fourth means coupled to the output of said first and second means to combine said first and second output signals, and a fifth means coupled to the output of said fourth means and the output of at least one of said second and third oscillators to provide a low noise, amplified version of said input signals having a frequency equal to at least one of said first and second frequencies.

16. A predetection combining circuit comprising a first source of input signals having a first frequency and a second source of input signals having a second frequency related to said first frequency in a predetermined manner, the signals of said first and second sources having unknown and varying phase relative to each other, a first variable reactance amplifier coupled to said first source, a second variable reactance amplifier coupled to said second source, a first oscillator coupled to said first and second amplifiers, a second oscillator, a third oscillator, a third variable reactance amplifier coupled to the output of said first and second oscillators, a first means coupled to the output of said first and third amplifiers to provide a first output signal equal to a low noise, amplified version of said input signals of said first source having a frequency different than said first and second frequencies, a fourth variable reactance amplifier coupled to the output of said first and third oscillators, a second means coupled to the output of said second and fourth oscillators to provide a second output signal equal to a low noise, amplified version of said input signals of said second source having a frequency equal to the frequency of said first output signal, a phase comparator coupled to the output of said first and second means to produce a control signal proportional to the phase difference between said first and second output signals, means to couple said control signal to each of said second and third oscillators to maintain said first and second output signals in a predetermined phase relationship with respect to each other for inphase combining thereof, a combiner coupled to the output of said first and second means to combine said first and second output signals, and a fifth variable reactance amplifier coupled to the output of said combiner and at least one of said second and third oscillators to provide a low noise, amplified version of said input signals having a frequency equal to said first and second frequencies.

17. A quadruple diversity signal combining circuit comprising a first, a second, a third and a fourth source of input signals each having a predetermined carrier frequency modulated by the same intelligence signal, the signals of said first, second, third and fourth sources having unknown and varying phase relative to each other, a first variable reactance amplifier coupled to said first source, a second variable reactance amplifier coupled to said second source, a first oscillator coupled to said first and second amplifiers, a first means coupled to the output of said first amplifier and said first oscillator to provide a first output signal equal to a low noise, amplified version of said input signals of said first source having a carrier frequency different than the carrier frequencies of the signal of said first and second sources, a second means coupled to the output of said second amplifier and said first oscillator to provide a second output signal equal to a low noise, amplified version of said input signals of said second source having a carrier frequency equal to the carrier frequency of said first output signal, a third means coupled to the output of said first and second means operable upon at least one of said first and second means to maintain said first and second output signals in a predetermined phase relationship with respect to each other for inphase combining thereof, a fourth means coupled to the output of said first and second means to combine said first and second output signals, a fifth means coupled to the output of said fourth means and at least one of said first and second means to provide a low noise, amplified version of said input signals having a carrier frequency equal to the carrier frequency of the signals of at least one of said first and second sources, a third variable reactance amplifier coupled to said third source, a fourth variable reactance amplifier coupled to said fourth source, a second oscillator coupled to said third and fourth amplifiers, a sixth means coupled to the output of said third amplifier and said second oscillator to provide a third output signal equal to a low noise, amplified version of said input signals of said third source having a carrier frequency different than the carrier frequencies of the signals of said third and fourth sources, a seventh means coupled to the output of said fourth amplifier and said second oscillator to provide a fourth output signal equal to a low noise, amplified version of said input signals of said fourth source having a carrier frequency equal to the carrier frequency of said third output signal, an eighth means coupled to the output of said sixth and seventh means and operable upon at least one of said sixth and seventh means to maintain said third and fourth output signals in a predetermined phase relationship with respect to each other for inphase combining thereof, a ninth means coupled to the output of said sixth and seventh means to combine said third and fourth output signals, a tenth means coupled to the output of said ninth means and at least one of said sixth and seventh means to provide a low noise, amplified version of said input signals having a carrier frequency equal to the carrier frequency of the signal of at least one of said third and fourth sources, and means to combine the output signal of said fifth means and said tenth means to provide a single output signal for said combining circuit providing diversity advantage for said intelligence signal.

18. A quadruple diversity signal combining system comprising a first, a second, a third and a fourth source of input signals each having a given intelligence signal and a predetermined center frequency, each of said input signals having unknown and varying phase relative to each other, a first predetection combining circuit coupled to said first and second source of input signals, a second predetection combining circuit coupled to said third and fourth source of input signals, each of said combining circuits including a first variable reactance amplifier coupled to one of said sources of input signals, a second variable reactance amplifier coupled to the other source of input signals, an oscillator coupled to said first and second amplifiers, a second oscillator, a third oscillator, a third variable reactance amplifier coupled to said first and second oscillators, a fourth variable reactance amplifier coupled to said first and third oscillators, a first means coupled to the output of said first and third amplifiers to provide a first output signal equal to a low noise, amplified version of the input signal of said one of said sources having a center frequency different than the predetermined center frequencies of the input signals of said sources, a second means coupled to the output of said second and fourth amplifiers to provide a second output signal equal to a low noise, amplified version of the input signals of said other of said sources having a frequency equal to the frequency of said first output signal, a phase comparator coupled to the output of said first and second means to provide a control voltage proportional to the phase difference between said first and second output signals, a fourth means to couple said control signal to at least one of said second and third oscillators to maintain said first and second output signals in a predetermined phase relationship with respect to each other for inphase combining thereof, a fifth means coupled to the output of said first and second means to combine said first and second output signals, and a fifth variable reactance amplifier coupled to the output of said fifth means and at least one of said second and third oscillators to provide a low noise, amplified version of said input signals having a center frequency equal to at least one of the center frequencies of the input signals of the two sources coupled to said predetection combining circuit, and a combining means coupled to the output of each of said predetection combining circuits to combine the output signals therefrom to provide a single signal including said given intelligence, and means coupled to said combining means to utilize said given intelligence.

References Cited in the file of this patent

UNITED STATES PATENTS

| | | |
|---|---|---|
| 2,192,275 | Royer | Mar. 5, 1940 |
| 2,200,613 | Zurravello | May 14, 1940 |
| 2,835,747 | Cluwen | May 20, 1958 |
| 2,850,585 | Green | Sept. 2, 1958 |

OTHER REFERENCES

K.K.N. Chang: "Four-Terminal Parametric Amplifier," Proc. I.R.E., Jan. 1959, pp. 81–82.

Olsen et al.: "Parametric Devices . . .," Proc. I.R.E., April 1959, pp. 587–588.